(12) United States Patent
Ojeda

(10) Patent No.: US 10,277,240 B1
(45) Date of Patent: *Apr. 30, 2019

(54) POLAR ANALOG-TO-DIGITAL CONVERTER AND DOWN CONVERTER FOR BANDPASS SIGNALS

(71) Applicant: Associated Universities, Inc., Washington, DC (US)

(72) Inventor: Omar Artemi Yeste Ojeda, Gordonsville, VA (US)

(73) Assignee: Associated Universities, Inc., Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/218,845

(22) Filed: Dec. 13, 2018

Related U.S. Application Data

(63) Continuation of application No. 15/919,962, filed on Mar. 13, 2018, now Pat. No. 10,158,370.

(60) Provisional application No. 62/471,585, filed on Mar. 15, 2017.

(51) Int. Cl.
| | |
|---|---|
| *H03D 3/00* | (2006.01) |
| *H03M 1/12* | (2006.01) |
| *H04B 1/00* | (2006.01) |
| *H04L 7/00* | (2006.01) |

(52) U.S. Cl.
CPC .......... *H03M 1/1245* (2013.01); *H03D 3/007* (2013.01); *H04B 1/0042* (2013.01); *H04L 7/0008* (2013.01); *H03D 2200/008* (2013.01)

(58) Field of Classification Search
None
See application file for complete search history.

(56) References Cited

U.S. PATENT DOCUMENTS

| | | | | |
|---|---|---|---|---|
| 4,982,193 A | * | 1/1991 | Saul | H03D 1/22 341/122 |
| 6,301,312 B1 | * | 10/2001 | Limberg | H04L 27/06 348/726 |
| 6,466,150 B1 | * | 10/2002 | Shah | H03M 1/36 341/155 |
| 6,829,311 B1 | * | 12/2004 | Riley | H03D 3/006 375/324 |
| 7,356,103 B2 | * | 4/2008 | Nishikawa | H04L 27/0014 375/345 |
| 7,692,570 B2 | * | 4/2010 | Martellock | H03M 1/1215 341/155 |

(Continued)

Primary Examiner — Howard Williams
(74) Attorney, Agent, or Firm — Remenick PLLC

(57) ABSTRACT

Methods and systems for generating a digital representation of the amplitude and phase of a bandpass signal are disclosed. The methods comprise filtering the bandpass signal with a bandpass filter, generating the real and imaginary parts of the complex analytic signal with a quadrature hybrid, determining the amplitude of the complex analytic signal by adding an even power-law transform of the real and imaginary parts of the complex analytic signal, and determining the phase of the complex analytic signal by comparing the real and imaginary parts of the complex analytic signal to zero and comparing an even power-law transform of the real and imaginary parts of the complex analytic signal to each other. Analog to digital converters and methods of converting complex analytic signals to digital signals are also disclosed.

35 Claims, 3 Drawing Sheets

(56) References Cited

U.S. PATENT DOCUMENTS

| | | | |
|---|---|---|---|
| 8,279,100 B2 * | 10/2012 | Caci | H03M 1/1215 341/155 |
| 8,482,445 B1 * | 7/2013 | Harris | H03M 1/1038 341/118 |
| 2013/0069812 A1 * | 3/2013 | Waltari | H03M 1/0626 341/166 |
| 2013/0170576 A1 * | 7/2013 | Liu | H04L 27/3854 375/295 |

* cited by examiner

POLAR ANALOG-TO-DIGITAL CONVERTER AND DOWN CONVERTER FOR BANDPASS SIGNALS

REFERENCE TO RELATED APPLICATIONS

This application is a continuation of U.S. Non-Provisional application Ser. No. 15/919,962, filed Mar. 13, 2018, which claims priority to U.S. Provisional Application No. 62/471,585, filed Mar. 15, 2017, both entitled "Polar Analog-To-Digital Converter and Down Converter for Bandpass Signals," and both hereby specifically and entirely incorporated by reference.

RIGHTS IN THE INVENTION

This invention was made with government support under Cooperative Agreement AST-1519126, between the National Science Foundation and Associated Universities, Inc., and, accordingly, the United States government has certain rights in this invention.

BACKGROUND

1. Field of the Invention

This invention is directed to analog to digital converters (ADC) and down converters for bandpass signals. More specifically, the invention is directed to generating the analog Hilbert transform of the bandpass signal by means of a quadrature (90-degree) hybrid.

2. Description of the Background

Sampling broadband signals with high relatively bandwidths is a complicated task. One approach is to consider the signal as a baseband signal and sample the signal at least at the Nyquist sampling rate. For a relative bandwidth of 100%, this implies a sampling rate at least 3 times the signal bandwidth. A second approach, known as undersampling or bandpass sampling, consists of directly sampling the RF/IF signal using a sampling frequency such that the frequency band of interest is entirely contained within the limits of one "Nyquist zone". In general, this requires a higher sampling frequency than the method proposed and is possible (with no additional hardware) only for a small enough relative bandwidth. A third approach would be to downconvert the signal, but once again, additional hardware is required and a good linearity can be achieved only if the relative bandwidth is small.

In some existing methods to sample broadband signals a Local Oscillator (LO) signal is inputted into a 90-degree hybrid whose outputs are then mixed with the input RF/IF signal, e.g. see (FIG. 4 of U.S. Pat. No. 7,356,103).

Another approach is to digitize directly the bandpass signal as if it were a baseband signal, using a sampling rate faster than the highest frequency. No quadrature hybrid is used in this method. For example, U.S. Pat. No. 4,982,193 provides a similar method to digitize at the carrier frequency, or preferably, one of its harmonics. Also, U.S. Pat. Nos. 8,279,100 and 7,692,570 each provide systems to directly digitize an RF signal at sampling rates commensurable with the signal bandwidth by means of a plurality of ADCs.

As another example of the existing methods, U.S. Pat. No. 6,466,150 provides an ADC that is suited for digitizing the phase of the signal. The method exclusively focuses on digitizing the phase only, with application to PM or FM signals. Moreover, the digitizer operates on baseband (downconverted) signals and does not utilize a full-wave rectifier, leading to more comparators (more power consumption) than the proposed method.

US Patent Application No. 2013/0069812 discloses an alternative method to digitize bandpass signals located in any Nyquist zone by means of a time-interleaved analog-to-digital converter. It applies to time-interleaved ADC is used and the Hilbert transform is applied in the digital domain, so the analog input is not a complex signal. This method suffers from the need of a calibration method inherent to its time-interleaved nature.

U.S. Pat. No. 8,482,445 also applies to time-interleaved ADCs, and hence it is also hindered by the need of complex calibration methods. The calibration method disclosed is a time-interleaved ADC by the injection of a probe tone at a different Nyquist zone. The Hilbert transform is applied in the digital domain.

U.S. Pat. No. 6,301,312 is directed to phase-locked loops. It employs a conventional IQ demodulation where the IF signal is mixed with the in-phase and quadrature versions of a local oscillator. This system uses mixers which can lead to mixer insertion loss, typically about 20 dB.

SUMMARY

The present invention overcomes the problems and disadvantages associated with current strategies and designs and provides new tools and methods for analog to digital converters (ADC) and down converters for bandpass signals.

One embodiment of the invention is directed to a method of determining an amplitude and phase of a complex analytic signal. The method comprises the steps of filtering the complex analytic signal with a bandpass filter, generating the real and imaginary parts of the complex analytic signal with a quadrature hybrid, determining the amplitude of the complex analytic signal by adding the real and imaginary parts of the complex analytic signal, and determining the phase of the complex analytic signal by comparing the real and imaginary parts of the complex analytic signal to zero and comparing an even power-law transform of the real and imaginary parts of the complex analytic signal to each other.

In a preferred embodiment, an amplitude generator circuit extracts the signal amplitude or a power-law thereof. Preferably, the amplitude generator is comprised of a lowpass filter to attenuate generated harmonics and a power-law inverter. The method preferably further comprises converting the amplitude of the complex analytical signal into binary signals with a linear quantizer. Preferably, the amplitude generator is comprised of a nonlinear quantizer.

In a preferred embodiment, the step of comparing an even power-law transform of the real and imaginary parts of the complex analytic signal to each other further comprises multiplying the even power-law transform of the real and imaginary parts of the complex analytic signal by multiple constant gains in their respective gain banks. The method preferably further comprises comparing scaled versions of the real and imaginary parts of the complex analytic signal with a bank of comparators to generate a phase binary signal.

Another embodiment of the invention is directed to a system adapted to output an amplitude and phase of a complex analytic signal. The system comprises a bandpass filter adapted to filter the complex analytic signal, a quadrature hybrid adapted to generate the real and imaginary parts of the complex analytic signal, a power-law device adapted to determine the amplitude of the complex analytic signal by adding the real and imaginary parts of the complex analytic signal, and a bank of comparators adapted to determine the phase of the complex analytic signal by comparing the real and imaginary parts of the complex analytic signal to zero and comparing an even power-law transform of the real and imaginary parts of the complex analytic signal to each other.

Preferably the system further comprises an amplitude generator circuit adapted to extract the signal amplitude or a power-law thereof. In a preferred embodiment, the amplitude generator is comprised of a lowpass filter to attenuate generated harmonics and a power-law inverter. The system preferably further comprises a linear quantizer adapted to convert the amplitude of the complex analytic signal into binary signals. The amplitude generator is preferably comprised of a nonlinear quantizer.

In a preferred embodiment the system comprises comparing an even power-law transform of the real and imaginary parts of the complex analytic signal to each other further comprises multiplying the even power-law transform of the real and imaginary parts of the complex analytic signal by multiple constant gains in their respective gain banks. The system preferably further comprises a bank of comparators to generate a phase binary signal.

Another embodiment of the invention is directed to a method of converting a bandpass analog signal to a digital signal. The method comprises the steps of generating the real and imaginary parts of a complex analytic signal with a quadrature hybrid, determining an amplitude of the complex analytic signal by adding an even power-law transform of the real and imaginary parts of the complex analytic signal, converting the signal amplitude into a digital amplitude signal with a quantizer, and converting a signal phase of the complex analytic signal into a digital phase signal by comparing the real and imaginary parts of the complex analytic signal to zero and comparing an even power-law transform of the real and imaginary parts of the complex analytic signal to each other.

Preferably, the amplitude is lowpass filtered to attenuate generated harmonics previous to the quantizer. In a preferred embodiment, a power-law inverter transforms the amplitude previous to the quantizer. The method preferably further comprises converting the amplitude of the complex analytic signal into binary signals with a linear quantizer. In a preferred embodiment, the amplitude generator is comprised of a nonlinear quantizer.

Preferably, the step of comparing an even power-law transform of the real and imaginary parts of the complex analytical signal to each other further comprises multiplying the even power-law transform of the real and imaginary parts of the complex analytical signal by multiple constant gains in their respective gain banks. The method preferably further comprises comparing scaled versions of an even power-law transform of the real and imaginary parts of the complex analytic signal with a bank of comparators to generate a digital phase signal with improved resolution. Preferably, at least one track-and-hold circuit holds a signal as dictated by a clock signal. Preferably the method further comprises preventing transitions from occurring within a clock cycle with a synchronizer.

Another embodiment of the invention is directed to an analog to digital converter (ADC), acting on a bandpass signal and its Hilbert transform. The ADC comprises a first power-law device adapted to apply an even non-linear transform on the input bandpass signal, a second power-law device adapted to apply an even non-linear transform on the input Hilbert transform signal, an amplitude generator adapted to determine a signal amplitude of the complex analytic signal of the input signal by adding the outputs of said power-law devices, a quantizer adapted to convert the output of said amplitude generator into a digital amplitude signal, an encoder adapted to reduce the number of bit signals used to represent the digital amplitude signal, and a bank of comparators adapted to generate a digital signal phase of the complex analytic signal by comparing the both input bandpass signal and its Hilbert transform to zero, and comparing the outputs of said power-law devices to each other.

Preferably, the amplitude generator is further comprised of a lowpass filter to attenuate generated harmonics. In a preferred embodiment, the amplitude generator is further comprised of a power-law inverter. The ADC preferably further comprises a linear quantizer adapted to convert the amplitude of the complex analytical signal into binary signals. Preferably, the amplitude generator is comprised of a nonlinear quantizer.

In a preferred embodiment the ADC comparing the outputs of the power-law devices further comprises multiplying the outputs by multiple constant gains in their respective gain banks, and the ADC further comprises: a bank of comparators to generate a digital phase signal and an encoder adapted to reduce the number of bit signals used to represent said digital phase signal. Preferably, the ADC further comprises at least one track-and-hold circuit adapted to hold a signal as dictated by a clock signal. Preferably, the ADC further comprises a synchronizer adapted to prevent transitions from occurring within a clock cycle with.

Other embodiments and advantages of the invention are set forth in part in the description, which follows, and in part, may be obvious from this description, or may be learned from the practice of the invention.

DESCRIPTION OF THE INVENTION

The systems and methods disclosed aim to solve the problem of analog-to-digital conversion of a bandpass signal with minimum sampling frequency. The method includes generating the analog Hilbert transform of the bandpass signal by means of a quadrature (90 degree) hybrid. The two outputs of the quadrature hybrid (the bandpass signal and its Hilbert transform) can be thought of as the real and imaginary parts of a complex signal. When such a complex signal is sampled at a rate equal to the signal bandwidth, a baseband copy of the signal will automatically be generated through aliasing.

The method consists of sampling the magnitude and phase of the complex signal, which are generated from the hybrid's outputs (the real and imaginary parts). The main advantage of sampling magnitude and phase (as compared to sampling real and imaginary parts) is that both samplers can share part of their circuitry, and hence decreases the total power consumption. Moreover, the precision of the converter is improved as the phase can be extracted by comparing the real and imaginary parts to each other, thereby removing the need of comparing the output to a calibrated absolute value. In addition, other nonidealities of the quantizer, such as nonlinearity and DC offset, are mitigated in the amplitude and phase result. Compared to baseband sampling and undersampling, the method utilizes a lower sampling rate, thereby avoiding some practical limitations due to circuitry speed. Finally, the system preferably uses less hardware than an IQ downconverter and sampler yet does not suffer from DC bias.

Figure 1:
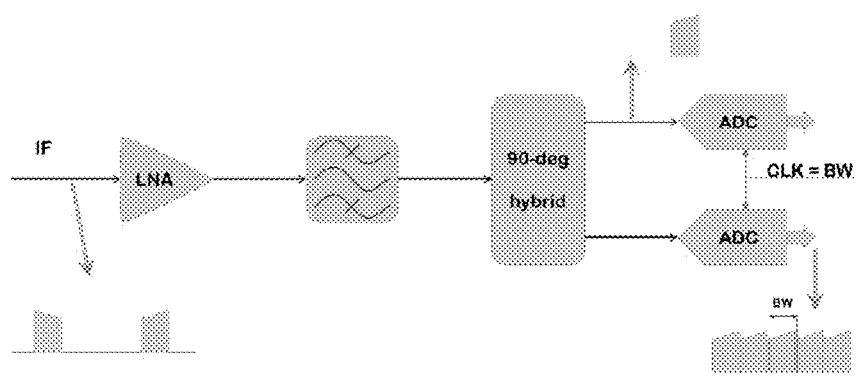
FIG. 1 depicts an embodiment of a complex sampling and demodulation using a quadrature hybrid.

Any real signal has a complex analytic signal associated to it, which can be obtained by adding the signal's Hilbert transform for the imaginary part. The Hilbert transform can be obtained through a quadrature (or 90-degree) hybrid, as shown in FIG. 1. Therefore, by sampling the two outputs of the quadrature hybrid at a sampling rate that is at least the signal bandwidth, a copy of the spectrum is aliased to baseband for further digital processing. For example, as shown in FIG. 1, an input bandpass signal (as represented by the spectrum symmetrical around the frequency origin) enters a low noise amplifier and is fed into a bandpass filter. The filtered signal is then fed into a 90-degree hybrid to obtain the Hilbert transform. The two outputs of the quadrature hybrid represent the real and imaginary parts of a complex signal whose spectrum is the input's spectrum where the negative frequency components have been cancelled out. Alternatively, the positive frequency components can be removed (while preserving the negative ones) by swapping the outputs of the hybrid. The real and imaginary outputs of the 90-hybrid are then fed to two separate ADCs at a sampling rate that is at least the bandwidth of the signal, in order to alias the signal to baseband for further digital processing. The resulting aliased spectrum after digitization is shown in FIG. 1 for a sampling frequency equal to the input bandpass signal's bandwidth. In practice, the negative frequency components (or the positive ones in the alternative configuration) cannot be perfectly removed by the hybrid's action and perturb the final result. However, this perturbation can be removed in the digital domain by means of a compensation filter, as explained, for instance, in [F. E. Churchill et al., IEEE Transactions on Aerospace Electronic Systems, vol. AES-17, no. 1, pp. 131-137, January 1981].

Figure 2:
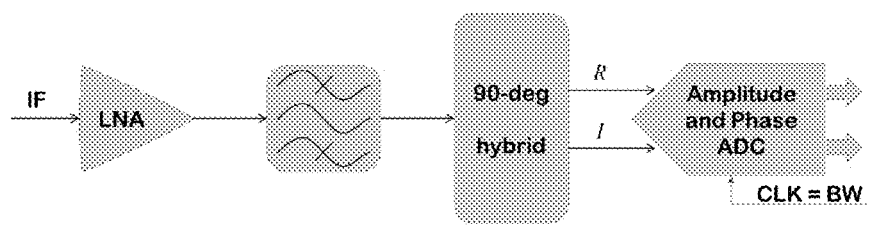
FIG. 2 depicts an embodiment of a polar analog-to-digital conversion and down conversion using a quadrature hybrid and an amplitude and phase ADC.

One embodiment of the current invention is directed to generating and sampling the amplitude and phase of the complex analytic signal instead of its real and imaginary parts. FIG. 2 shows an example of a complete system where the real and imaginary parts of the complex analytic signal are generated through a quadrature hybrid, as in FIG. 1, and, instead, serve as inputs of the polar analog-to-digital converter and down converter. A detailed description of said converter follows.

One advantage of the polar analog-to-digital converter is that both amplitude and phase generation circuits share part of the circuitry and hence decrease both the power consumption and the amplitude-phase imbalance. The principle of generation is preferably as follows: A symmetrical (even function) power-law transformation is applied to both the real and imaginary inputs:

$$R_e(t)=|R(t)|^\alpha$$

$$I_e(t)=|I(t)|^\alpha \quad (1)$$

where $\alpha \in \mathbb{R}$ except zero. The amplitude signal can be preferably generated from the sum of $R_e(t)$ and $I_e(t)$ as follows:

$$A_e(t)=R_e(t)+I_e(t)=|R(t)|^\alpha+|I(t)|^\alpha=A^\alpha(t)[|\cos \varphi(t)|^\alpha+|\sin \varphi(t)|^\alpha] \quad (2)$$

where A(t) and φ(t) are the amplitude and phase, respectively, of the ADC's input signal. It can be shown that the term within brackets contains a constant term in addition to spectral components at multiples of the fourth harmonic of the signal component. Thus, those unwanted harmonics can be filtered out by means of a lowpass filter or simply neglected. In the latter case, assuming α is close enough to 2, the harmonic components vanish because the term within brackets in eq. (2) is equal to 1, and hence:

$$A_e(t)=A^2(t) \quad (3)$$

In any case, the amplitude signal, $A_e(t)$, or a power-law transformation thereof can be readily sent to the analog-to-digital converter's quantizer.

Figure 3:
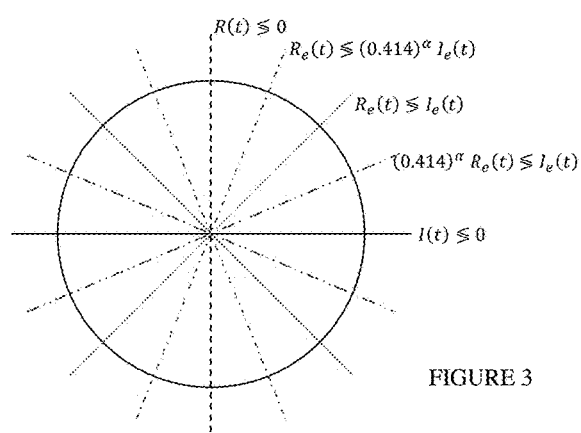
FIG. 3 depicts an embodiment of a graphical representation of the phase quantization method.

With regards to the phase signal, comparing both the real and imaginary part to zero will extract their sign, and hence the information about which quadrant of the unit circle the phase is located. Additionally, the phase within a quadrant can be determined from comparing the even power-law transformation of the real and imaginary parts to each other. For example, from the comparison:

$$R_e(t) \lessgtr I_e(t) \Leftrightarrow |R(t)| \lessgtr |I(t)| \quad (4)$$

along with the signs of the real and imaginary parts, one can determine if the phase is greater or less than 45, 135, −45, and −135 degrees. Consequently, by comparing the even transformation of the real and imaginary parts instead of the real and imaginary parts themselves, the number of required comparisons decreases from $2^{b-1}$ to $(2^{b-2}+1)$, i.e., approximately half the number of comparisons are required. Therefore, the power consumption can preferably be reduced by half as well. The rationale behind the phase quantization is represented graphically in FIG. 3 for a 4-bit quantization example.

Figure 4:
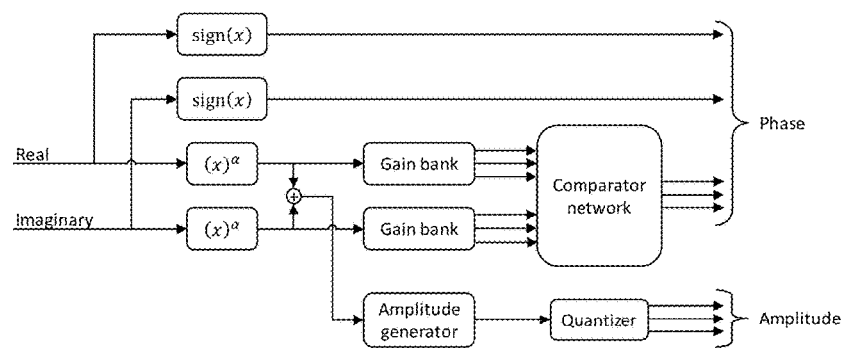
FIG. 4 depicts an embodiment of a functional diagram of system described herein.

FIG. 4 depicts a functional block diagram of an embodiment of a system utilizing the method described herein. As explained in the foregoing discussion, the inputted real and imaginary parts are compared to zero in order to extract their sign, and then are preferably passed through a power-law device. From the addition of the power-law devices, an amplitude generator circuit preferably extracts the signal amplitude, or a power-law thereof. Such a device is highly dependent on the power, α, and the required spurious level. In general, it is composed of a lowpass filter to attenuate the generated harmonics, and a power-law inverter, e.g., the square root if α=2. Then a linear quantizer preferably converts the analog amplitude into binary signals. Alternatively, the power-law inverter can be removed, and a nonlinear quantizer is used instead. To generate the phase bits, the outputs of the power-law devices are preferably multiplied by multiple constant gains in their respective gain banks. For example, 1 and $(0.414)^\alpha$ are the gains preferably needed for a 4-bit phase quantization (see FIG. 3). Finally, a bank of comparators preferably compares the scaled versions of $R_e(t)$ and $I_e(t)$ to generate the phase binary signals, which join the sign signals mentioned before.

Figure 5:
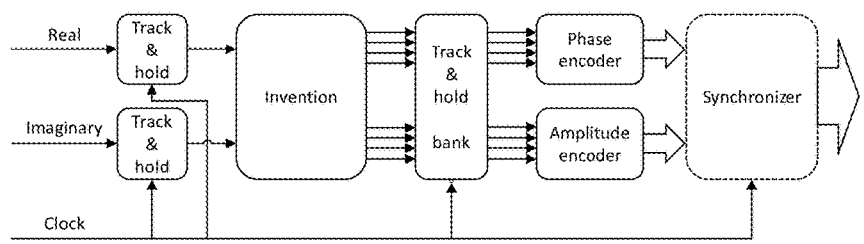
FIG. 5 depicts an embodiment of an analog-to-digital converter based on the invention.

By itself, the embodiment sketched in FIG. 4 does not constitute a complete analog-to-digital converter. FIG. 5 shows a possible embodiment of such an ADC based on the present invention. First, the voltages of the real and imaginary parts are preferably held at specific sampling instants dictated by a clock signal through their respective track-and-hold circuits. Then, the proposed invention, as shown in FIG. 4, preferably generates the quantized amplitude and phase binary signals. A subsequent track-and-hold bank (e.g. a bank of flip-flops or a sample and hold circuit) preferably holds these signals for the entire clock cycle. Thereupon, an encoder preferably converts the results of the comparators into meaningful bits, and finally, a synchronizer (flip-flop bank) may be used to prevent transitions from occurring within a clock cycle in lieu of at its boundaries. Note that the relative location of the track-and-hold circuitry with respect to the present invention can be varied with respect to FIG. 5, possibly impacting the maximum speed of the system. For instance, a single sample-and-hold circuit could be located either at the input or output of the present invention while replacing both track-and-hold circuits in FIG. 5. Additionally, the track-and-hold circuitry could be integrated with the different components of the exemplary embodiment in FIG. 4. The amplitude-and-phase ADC shown in FIG. 5 can be used as previously shown in FIG. 2 to create a polar analog-to-digital converter and demodulator for bandpass signals.

Figure 6:
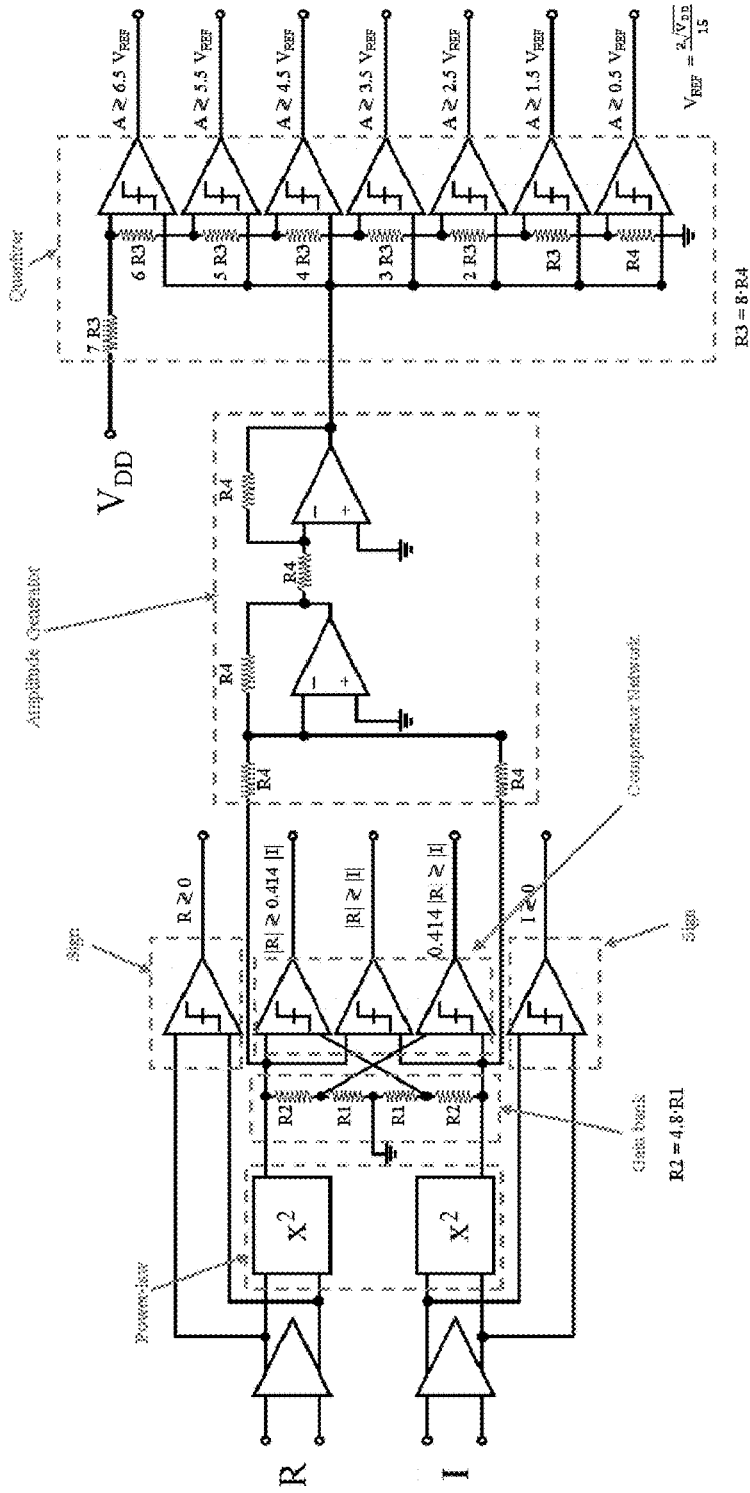
FIG. 6 depicts an embodiment of an implementation of the invention.

FIG. 6 plots one example of a circuit implementing the embodiment from FIG. 4. Both the real and imaginary inputs are connected to their respective differential buffers. The outputs thereof are connected to their respective sign extractors and power-law devices. In this example, the sign device is a latch comparator and the power-law chosen is $\alpha=2$. The outputs of the power-law devices are connected to a bank of latch comparator, a resistor-based gain bank, and an amplitude generator circuit. The resistor-based (could be capacitor based as well) gain bank scales the squared input by a factor of $(0414)^\alpha$ by proper choice of the relative resistor's values ($R2=4.8 \cdot R1$). Said scaled versions are inputted to the comparator network where a bank of latch comparators generates the output binary signals (in addition to the sign of the inputs) according to the phase quantization method represented in FIG. 3. The outputs of the squaring devices are added by the first inverting amplifier of the amplitude generator circuit. Said inversion is undone by a second inverting amplifier which serves as input buffer of the amplitude quantizer as well. The output of amplitude generator is the squared amplitude, and hence the quantizer is nonlinear (quadratic), i.e., it compares the squared amplitude with reference voltages which produce a thermometer coding of the amplitude in uniformly spaced quantization intervals. Said reference voltages can be generated by means of a reference voltage applied to a set of resistors in series with proper relative values (as indicated in FIG. 6). A set of latch comparators produce the binary signals representing the quantized amplitude using thermometer coding. For example, the reference voltage at the lowest comparator is $V_{DD} \times R4/(28\ R3+R4) = V_{DD}/255$, if $R3 = 8 \cdot R4$. As a result, the binary output of the first comparator is equal to $A^2 \lessgtr V_{DD}/255$, or equivalently, $A \lessgtr \sqrt{V_{DD}}/15$. Similarly, the next reference level becomes: $V_{DD} \times (R3+R4)/(28\ R3+R4) = V_{DD} \times 9/255$, and its corresponding binary output, $A \lessgtr 3\sqrt{V_{DD}}/15$. By defining, $V_{REF} \lessgtr 2\sqrt{V_{DD}}/15$, the binary signals indicated in FIG. 6 are obtained.

Digitizing the amplitude and phase instead of the real and imaginary parts produces a simplified circuitry over traditional circuits, which preferably reduces the power consumption and increases the analog bandwidth of the converter. One polar ADC substitutes two independent ADCs for the real and imaginary parts, and thus, avoids problems arising from poor calibration and/or synchronization between said ADCs. The system has general applications as an analog-to-digital converter, and it is suitable for simplifying various subsequent digital signal processing, such as digital PLLs, PM/FM demodulators, etc., where phase extraction or complex multiplication, for instance, are the first steps in the processing chain.

Other embodiments and uses of the invention will be apparent to those skilled in the art from consideration of the specification and practice of the invention disclosed herein. All references cited herein, including all publications, U.S. and foreign patents and patent applications, are specifically and entirely incorporated by reference. The term comprising, where ever used, is intended to include the terms consisting and consisting essentially of. Furthermore, the terms comprising, including, and containing are not intended to be limiting. It is intended that the specification and examples be considered exemplary only with the true scope and spirit of the invention indicated by the following claims.

The invention claimed is:

1. A method of determining an amplitude and phase of a bandpass signal, comprising the steps of:
    generating real and imaginary parts of an analytic representation of said bandpass signal through a quadrature hybrid, wherein the real and imaginary parts of an analytic representation of said bandpass signal is an analytic signal;
    determining an amplitude of the analytic signal by adding an even power-law transform of the real and imaginary parts of the analytic signal; and
    determining a phase of the analytic signal by comparing the real and imaginary parts of the analytic signal to zero and comparing the even power-law transform of an absolute value of the real and imaginary parts of the analytic signal to each other.

2. The method of claim 1, wherein an amplitude generator circuit extracts the signal amplitude or a power-law thereof.

3. The method of claim 2, wherein the amplitude generator is comprised of a lowpass filter to attenuate generated harmonics and a power-law inverter.

4. The method of claim 3, further comprising converting the amplitude of the analytic signal into binary signals with a linear quantizer.

5. The method of claim 2, wherein the amplitude generator is comprised of a nonlinear quantizer.

6. The method of claim 1, wherein the step of comparing an even power-law transform of the real and imaginary parts of the analytic signal to each other further comprises multiplying the even power-law transform of the real and imaginary parts of the analytic signal by multiple constant gains in their respective gain banks.

7. The method of claim 6, further comprising comparing scaled versions of the real and imaginary parts of the analytic signal with a bank of comparators to generate a phase binary signal.

8. The method of claim 1, where the even power-law transform of the real and imaginary parts of the analytic signal are logarithmically converted prior to their comparison to each other.

9. A system adapted to output an amplitude and phase of a bandpass signal, comprising:
    a quadrature hybrid adapted to generate real and imaginary parts of an analytic representation of said bandpass signal, wherein the real and imaginary parts of an analytic representation of said bandpass signal is an analytic signal;

a power-law device adapted to determine an amplitude of the analytic signal by adding an even power-law transform of the real and imaginary parts of the analytic signal; and a bank of comparators adapted to determine a phase of the analytic signal by comparing the real and imaginary parts of the analytic signal to zero and comparing the even power-law transform of the real and imaginary parts of the analytic signal to each other.

10. The system of claim 9, further comprising an amplitude generator circuit adapted to extract the signal amplitude or a power-law thereof.

11. The system of claim 10, wherein the amplitude generator is comprised of a lowpass filter to attenuate generated harmonics and a power-law inverter.

12. The system of claim 11, further comprising a linear quantizer adapted to convert the amplitude of the analytic signal into binary signals.

13. The system of claim 10, wherein the amplitude generator is comprised of a nonlinear quantizer.

14. The system of claim 9, wherein comparing an even power-law transform of the real and imaginary parts of the analytic signal to each other further comprises multiplying the even power-law transform of the real and imaginary parts of the analytic signal by multiple constant gains in their respective gain banks.

15. The system of claim 14, further comprising a bank of comparators to generate a phase binary signal.

16. The system of claim 9, further comprising respective logarithmic amplifiers which act on an even power-law transform of the real and imaginary parts of the analytic signal prior to their comparison to each other.

17. A method converting a bandpass analog signal to a digital signal, comprising the steps of:

generating real and imaginary parts of an analytic representation of said bandpass signal with a quadrature hybrid, wherein the real and imaginary parts of an analytic representation of said bandpass signal is an analytic signal;

determining an amplitude of the analytic signal by adding an even power-law transform of the real and imaginary parts of the analytic signal;

converting the signal amplitude into a digital amplitude signal with a quantizer; and converting a signal phase of the analytic signal into a digital phase signal by comparing the real and imaginary parts of the analytic signal to zero and comparing an even power-law transform of the real and imaginary parts of the analytic signal to each other.

18. The method of claim 17, wherein the amplitude is lowpass filtered to attenuate generated harmonics previous to the quantizer.

19. The method of claim 17, wherein a power-law inverter transforms the amplitude prior to the quantizer.

20. The method of claim 19, further comprising converting the amplitude of the analytic signal into binary signals with a linear quantizer.

21. The method of claim 17, wherein the amplitude generator is comprised of a nonlinear quantizer.

22. The method of claim 17, wherein the step of comparing an even power-law transform of the real and imaginary parts of the analytic signal to each other further comprises multiplying the even power-law transform of the real and imaginary parts of the analytic signal by multiple constant gains in their respective gain banks.

23. The method of claim 22, further comprising comparing scaled versions of an even power-law transform of the real and imaginary parts of the analytic signal with a bank of comparators to generate a digital phase signal with improved resolution.

24. The method of claim 17, wherein at least one track-and-hold circuit holds a signal as dictated by a clock signal.

25. The method of claim 17, preventing transitions from occurring within a clock cycle with a synchronizer.

26. The method of claim 17, further comprising logarithmic amplifiers which act on an even power-law transform of the real and imaginary parts of the analytic signal previous to their comparison to each other.

27. An analog to digital converter (ADC), acting on a bandpass signal and its Hilbert transform, comprising:

a first power-law device adapted to apply an even non-linear transform on the input bandpass signal;

a second power-law device adapted to apply an even non-linear transform on the input Hilbert transform signal;

an amplitude generator adapted to determine a signal amplitude of an analytic representation of the input signal by adding the outputs of said power-law devices, wherein the real and imaginary parts of an analytic representation of said bandpass signal is an analytic signal;

a quantizer adapted to convert the output of said amplitude generator into a digital amplitude signal;

an encoder adapted to reduce the number of bit signals used to represent the digital amplitude signal; and a bank of comparators adapted to generate a digital signal phase of the analytic signal by comparing the both input bandpass signal and its Hilbert transform to zero, and comparing the outputs of said power-law devices to each other.

28. The ADC of claim 27, wherein the amplitude generator is further comprised of a lowpass filter to attenuate generated harmonics.

29. The ADC of claim 28, wherein the amplitude generator is further comprised of a power-law inverter.

30. The ADC of claim 29, further comprising a linear quantizer adapted to convert the amplitude of the analytic signal into binary signals.

31. The ADC of claim 27, wherein the amplitude generator is comprised of a nonlinear quantizer.

32. The ADC of claim 27, wherein comparing the outputs of the power-law devices further comprises multiplying the outputs by multiple constant gains in their respective gain banks; and the ADC further comprises:

a bank of comparators to generate a digital phase signal; and an encoder adapted to reduce the number of bit signals used to represent said digital phase signal.

33. The ADC of claim 27, further comprising at least one track-and-hold circuit adapted to hold a signal as dictated by a clock signal.

34. The ADC of claim 27, further comprising a synchronizer adapted to prevent transitions from occurring within a clock cycle with.

35. The ADC of claim 27, further comprising logarithmic amplifiers which act on an even power-law transform of the real and imaginary parts of the analytic signal previous to their comparison to each other.

* * * * *